(12) United States Patent
Verdiell et al.

(10) Patent No.: US 7,452,236 B2
(45) Date of Patent: Nov. 18, 2008

(54) CABLING FOR RACK-MOUNT DEVICES

(75) Inventors: Jean-Marc Verdiell, Palo Alto, CA (US); Peter Kirkpatrick, San Francisco, CA (US); Marc Epitaux, Sunnyvale, CA (US)

(73) Assignee: Aprius, Inc., Sunnyvale, CA (US)

( * ) Notice: Subject to any disclaimer, the term of this patent is extended or adjusted under 35 U.S.C. 154(b) by 0 days.

(21) Appl. No.: 11/670,309

(22) Filed: Feb. 1, 2007

(65) Prior Publication Data
US 2008/0186667 A1 Aug. 7, 2008

(51) Int. Cl.
*H01R 13/60* (2006.01)
(52) U.S. Cl. ................................... 439/540.1
(58) Field of Classification Search ............ 439/540.1, 439/501, 532, 709, 719, 638–639, 626, 284, 439/594, 701, 715–717, 901, 928.1, 76.1, 439/564, 573; 361/683–686, 725–727, 752, 361/796, 622, 627, 633, 640
See application file for complete search history.

(56) References Cited
U.S. PATENT DOCUMENTS
4,840,568 A * 6/1989 Burroughs et al. ............ 439/49
5,604,662 A * 2/1997 Anderson et al. ............ 361/685
7,114,994 B2 * 10/2006 Garnett et al. ............. 439/638

* cited by examiner

Primary Examiner—Edwin A. León
(74) Attorney, Agent, or Firm—Courtney Staniford & Gregory LLP (57) ABSTRACT

A connector module is provided that includes a longitudinal body adapted for installation in a computer equipment rack capable of housing a plurality of server units positioned in a stack configuration. The longitudinal body has a plurality of data connectors mounted along an outer surface. Each data connector is located at a different location along the outer surface of the longitudinal body and is adapted to receive a signal source introduced from a front side of the outer surface. The connector module includes a collection of signal paths coupled to the plurality of data connectors. Signal paths are positioned toward a backside of the outer surface. The longitudinal body is adapted for installation in a transverse orientation relative to the plurality of server units in the stack configuration such that each data connector is positioned in proximity to a connector mounted on a corresponding one of the server units.

51 Claims, 7 Drawing Sheets

CABLING FOR RACK-MOUNT DEVICES

CROSS-REFERENCES TO RELATED APPLICATIONS

This application is related to co-owned and co-pending U.S. patent application Ser. No. 11/681,950, which is hereby incorporated by reference.

BACKGROUND OF THE INVENTION

Rack mount systems are standardized systems for mounting electronic equipment such as computer servers in a vertical, stacked configuration. For example, a common standard rack mount system is the 19 inch rack system (Electronic Industries Alliance—EIA 310-D) so named because the overall rack width in the system is 19 inches. A rackmount system typically comprises a cabinet with an open front and back which allows access to electronic components mounted in the rackmount system and encourages dissipation of excess heat from the electronic devices. A typical rackmount system, such as a 19-inch rack system, includes a set of parallel rails that runs vertically along the front of the cabinet. The rails are pierced at regular intervals with mounting holes for mounting electronic devices, and electronic devices are generally mounted in the rackmount system by fastening the electronic device to the rails via bolts or via a set of clips attached to the electronic device.

The mounting holes in the rails of a typical 19-inch rackmount system are positioned in groups of three. Each group of three mounting holes is spaced apart in 1.75 inch increments referred to as "units" (sometimes written as "U"). Generally, a rackmount electronic device is sized to according the number of units of vertical space that the device requires. For example, a rackmount server may be three units high while a switch may be two units high. If both devices are to be mounted in the same rackmount system, a total of five units of free space would need to be available in the rackmount system.

An electronic device in a rackmount system often must communicate with other electronic devices in the rackmount system. Data cables are typically used to carry data signals between the electronic devices. As the number of components in the rackmount system increases, the number of and length of the data cables can make the cables difficult to maintain. One solution is to bundle cables together and/or use cable harnesses when routing data cables through the rackmount system. However, the cables still must be custom cut to the proper length by hand, and tracking down of faults in the system can become extremely difficult.

Furthermore, the data cables themselves can add latency to data communications between components. As the length of data cables increases, electrical signals must travel across longer lengths of cable which not only increases the length of time that signals take to reach their destination, but may also increase the likelihood of distortion, noise, and/or interference detrimentally affecting signal quality.

Blade server systems provide one alternative to rackmount server systems. Blade servers are self-contained computer servers with a small profile that enables a large number of servers to be installed in a smaller space. Blade servers typically have a smaller profile than rackmount servers, because blade servers do not include a number of components typically included in typical rack-mount servers such as separate cooling components, power supplies, and networking components. Unlike typical rackmount servers, blade servers rely upon a blade server enclosure to provide services such as power, network connectivity, and cooling. Thus, blade server systems require specialized electronic devices designed to operate with blade server systems, and typical rackmount devices such as rackmount computer servers are not compatible with blade server systems. Therefore, blade server systems are not always adequate solution for implementing computer server systems.

A solution adapted to use rackmount electronic devices while decreasing the number and length of data cables required to interconnect electronic devices in a typical rackmount system is required.

BRIEF SUMMARY OF THE INVENTION

The present invention provides a system for interconnecting rack-mounted electronic components such as rack mounted computer servers. The system provides an interconnect strip comprising a connector module including a plurality of data connectors which may be coupled to rack mounted electronic component and also includes a plurality of data signal paths interconnecting the plurality of data connectors to enable data communications between the rack mounted electronic components coupled to the data connectors.

Embodiments of the present invention advantageously decrease both the length and number of cables needed to interconnect rack mounted electronic components. Furthermore, in some embodiments, the interconnect strip enables optical connections between components. Optical connections via optical fiber permit digital communications over larger distances and at higher data rates than electronic components. In some embodiments, the system provides electrical-optical transceivers for receiving an optical signal via an uplink port and transmitting electrical signals across the plurality of data signal paths of the interconnect strip and vice versa. In other embodiments the system is adapted to receive electrical signals via an uplink port and convert the electrical signals to optical signals with an electrical-optical transceiver. In yet other embodiments, the system provides electrical-optical transceivers integrated into the interconnect strip for receiving electrical data signals from rack mounted devices and transmitting optical signals across the plurality of data signal paths of the interconnect strip and vice versa. In other embodiments, the electrical-optical transceivers are built into rack mounted electronic components and the rack mounted electronic components are coupled to the interconnect strip via an optical connection.

In an embodiment of the present invention, a connector module is provided. The connector module includes a longitudinal body adapted for installation in a computer equipment rack that is capable of housing a plurality of server units positioned in a stack configuration. The longitudinal body has a plurality of data connectors mounted along an outer surface. Each of the data connectors is located at a different location along the outer surface of the longitudinal body and is adapted to receive a signal source introduced from a side of the outer surface. The connector module also includes a collection of signal paths coupled to the plurality of first data connectors. The signal paths are positioned affixed to the longitudinal body. The longitudinal body is adapted for installation in a transverse orientation relative to the plurality of server units in the stack configuration in order to position each of the first plurality of data connectors in proximity to a connector mounted on a corresponding one of the plurality of server units.

Other features and advantages of the invention will be apparent in view of the following detailed description and preferred embodiments.

DETAILED DESCRIPTION OF THE INVENTION

Embodiments of the invention are described here, with reference to the figures. Where elements of the figures are called out with reference numbers, it should be understood that like reference numbers refer to like elements and might or might not be the same instance of the element.

Figure 1:
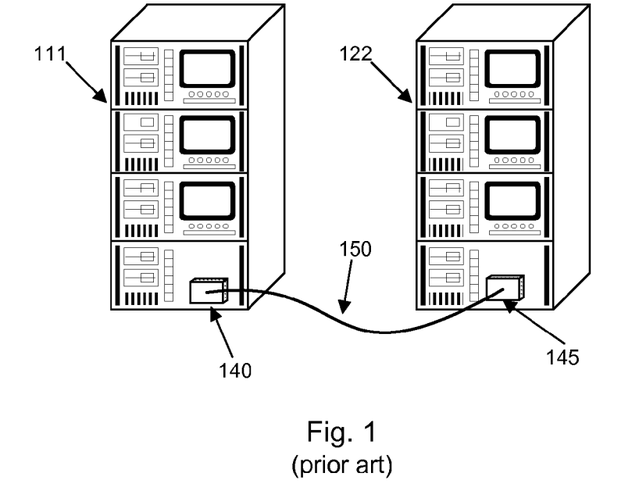
FIG. 1 is a block diagram of prior art rackmount servers.

FIG. 1 is a block diagram of prior art rackmount systems. Rackmount systems 111 and 122 are connected by a data cable 150 which is coupled to rackmount system 111 via data connector 140 and coupled to rackmount system 122 via data connector 145. Data cable 150 enables electronic devices mounted in rackmount system 111 to communicate with electronic devices mounted in rackmount system 122 and vice versa. Data cable 150 carries electrical data signal. Data cable 150 may comprise any cable adapted to carrying electrical data signals, such as twisted pair or coaxial cable.

Figure 2:
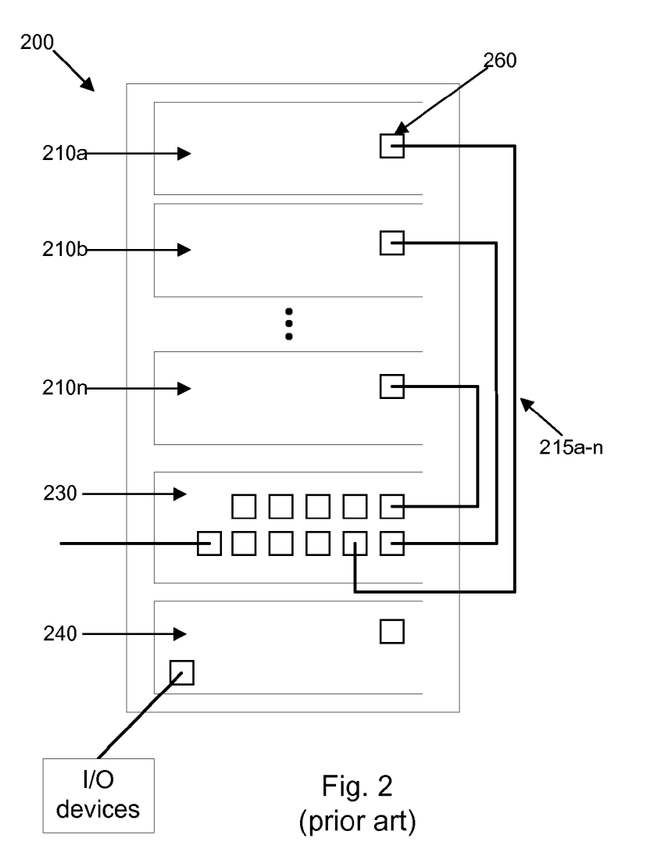
FIG. 2 is a block diagram of a prior art rackmount system.

FIG. 2 is a block diagram of typical prior art rackmount system. Rackmount system 200 comprises an external cabinet including a set of rails for mounting a plurality of electronic components. As described above, the electronic components generally must be a minimum of 1U high. Many rack-mount electronic components are a multiple of 1U high. For example, a rack-mount server unit may be 3U high. A typical approach for interconnecting electronic devices mounted in the rackmount system is to use jumper cables. For example, in some implementations, the rackmount system includes a plurality of server systems. Each of the server systems is connected to a central switch, such as an Ethernet switch, via a data cable. Each of the data cables must be cut to the appropriate length and routed through the rackmount system by hand. Cables may be secured together and routed through the server system in a cable bundle or by using a cable harness. Conventional cables such as these cannot be used effectively when data rates increase past 10 gigabits per second.

Rackmount system 200 includes a plurality of computers servers 210a-210n, network switch 230, and management switch 240. Computer servers 210a-210n are conventional rack-mount servers. Network switch 230 provides network connectivity for the various electronic components mounted in rackmount system 200. Network switch 230 may use a variety of networking mediums for connecting devices, such as Ethernet, PCI-Express, InfiniBand, Fibre Channel, ATM, and/or other networking mediums. For example, network switch 230 may be an Ethernet switch coupled to the plurality of computer servers 210a-210n via Ethernet connections.

Management switch 240 provides an interface that allows a user to control rack-mounted electronic devices such as computer servers 210a-210n. Management switch 240 may be adapted for switching a plurality of control signal types. In some embodiments, management switch 240 comprises an Ethernet management switch where control signals are transmitted over an Ethernet management connection. For example, the control signals may include keyboard-video-mouse (KVM) signals that enable a user to control various rack-mounted component from a single keyboard, video monitor, and mouse. In a typical rackmount system, a separate Ethernet management connection and Ethernet data connection will generally be provided. Ethernet management connections provided for transmitting control signals will generally be slower than Ethernet data connections provided for transmitting data. For example, a 10 gigabit per second Ethernet data connection may be provided for transmitting data to and from the various rack-mounted components, while a 1 gigabit per second Ethernet management connection is provided for transmitting control signals.

In other embodiments, management switch 240 may, for example, comprise a keyboard-video-mouse (KVM) switch that provides a user interface that allows a user to control computer servers 210a-210n from a single keyboard, video monitor, and mouse. KVM switches are often used in rackmount systems where a dedicated set of input and output (I/O) devices such as a monitor, keyboard and/or mouse are not required for each individual rackmount server. In a typical configuration, a computer display device, a keyboard and a mouse are connected to a KVM switch and the KVM switch is connected to each computer server via a KVM I/O cable. In some implementations, a KVM switch provides a physical selector identifying a particular computer server to be controlled at that time. In alternative embodiments, switching control from one computer server to another may also be implemented as a software switch activated by a set of keystrokes on a keyboard or an input entered via another I/O device connected to the KVM switch.

FIG. 2 illustrates a typical configuration for a rackmount system wherein an Ethernet switch 230 is included in a bottom position in the rack. In some embodiments, the Ethernet switch may also be located at a top position in the rack or in other locations within the rack in yet other embodiments. Each of the plurality of computer servers 210a-210n is connected to switch 230 by a data cable. As shown, the plurality of data cables 215a-n enables bidirectional data communications between computer servers 210a-210n and/or switch 230 using electrical signals. The plurality of data cables 215a-n may, for example, comprise Ethernet cables. The plurality of data cables couple to the plurality of data connectors 260. The typical approach for interconnecting electronic components in a rackmount system is to use data cables.

Here, each cable has to be custom cut to the appropriate length and routed through the rackmount system by hand. Cable bundles harnesses may be created or cable harnesses used to group the cables together to more neatly route the cables through the rackmount system. However, the bundles and/or harnesses consume a lot of space in the rackmount system and locating faults in the system can be very difficult and time consuming. Furthermore, conventional cables become prohibitively expensive when data rates increase beyond 10 gigabits per second.

Rackmount system 200 includes only a small number of computer servers to illustrate the concepts discussed herein. As discussed above, a typical rackmount system may include a large number of servers and/or other electronic devices. Thus, the number and length of cables may become both unwieldy and unmanageable as the number of electronic devices increases. The rackmount system provided by the present invention overcomes these and other problems.

Figure 3:
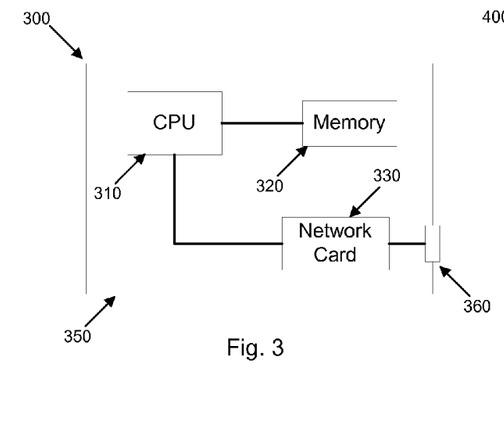
FIG. 3 is block diagram of a prior art rack mount server.

FIG. 3 is a block diagram of a typical rackmount server. Server 300 includes CPU 310, random access memory 320, network card 330, and data connector 360. Server 300 also includes outer case 350 adapted for mounting server 300 into a rackmount system such as the one described in FIG. 2 above. Server 300 may also in some embodiments include a persistent memory for storing data such as a flash memory, a hard disk drive, an optical medium such as a DVD or CD, or other persistent memory or a combination of persistent memory types. CPU 310 executes application and/or operating system programs which may be stored at least in part in memory 320 and/or in a persistent memory either onboard or off-board server 300. CPU 310 may also read data from and write data to random access memory 320 while executing application and/or operating system programs. CPU 310 is connected to memory 320 via data bus or other communication link. CPU 310 is also connected to network card 330 via a data bus or other communication link. Network card 330 provides network connectivity to server 300 by transmitting and/or receiving data signals across an external network connection. In some embodiments, network card 330 is an Ethernet card. Network card 330 is coupled to data connector 360 which is adapted to connect to an external communications medium, such as an Ethernet cable or an optical fiber.

Figure 4:
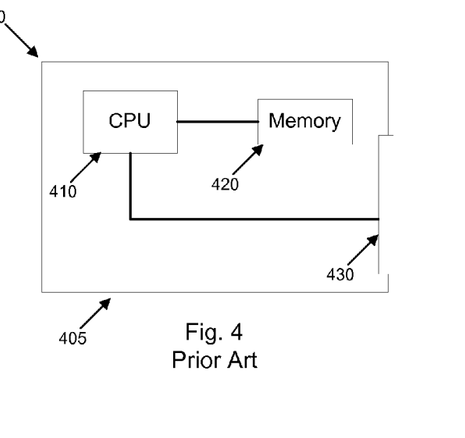
FIG. 4 is a block diagram of a prior art blade server.

FIG. 4 is a block diagram of a prior art blade server 400. A blade server is a self-contained computer system. Blade servers typically are more compact than rackmount servers because blade servers rely upon a blade server system 500 (see FIG. 5) to provide a number of services, such as network connectivity, cooling, and power. Because a blade server system 500 provides these services, the components that a typical server would include to provide these services need not be included on the individual blade servers. In some instances, the blade server system also provides access to persistent data storage. Blade server 400 comprises PCB 405, CPU 410, memory 420, and bus interface 430. Bus interface 430 provides an interface for coupling blade server 400 to one of a plurality of data ports 520 on backplane 505 of blade server system 500. Backplane 505 provides a plurality of ports for mating to bus interface 430 of a plurality of blade servers 400 to enable data communications between blade server 400 and blade server system 500. Communications across backplane 505 and between the plurality of blade servers 430 and backplane 505 occur via electrical data signals.

Figure 5:
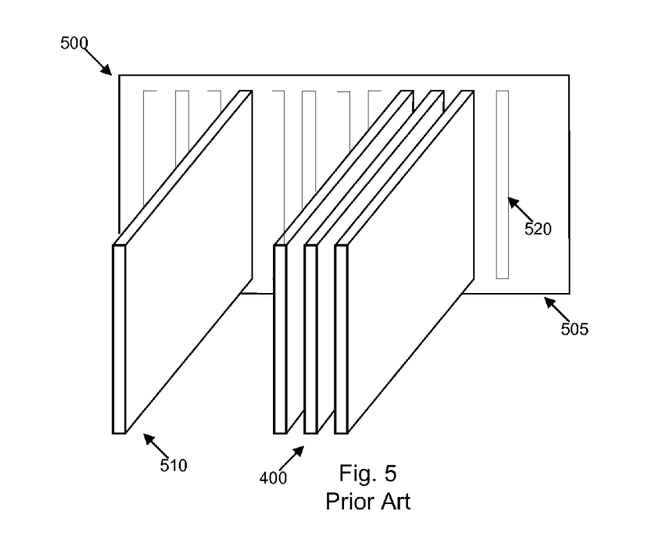
FIG. 5 is a block diagram of a prior art blade server system.

As noted above, blade server systems such as that depicted in FIGS. 4 and 5 use specialized hardware. Typical rackmount hardware such as that described in FIGS. 2 and 3 are generally not compatible with blade server systems. Therefore, the present invention has an advantage over the blade server systems by enabling the use of widely available rack mounted electronic devices. Furthermore the present invention also advantageously uses faster optical connections for data communications between devices in some embodiments. Moreover, some embodiments of the present invention may be used to interconnect blade servers to electronic devices coupled to an interconnect strip. For example, in an embodiment, a plurality of blade servers are coupled together and the plurality of blade servers are also coupled to a network I/O blade. The network I/O blade may then be coupled to the interconnect strip via a data cable coupled to an external connector of the interconnect strip. Thus, rackmount components and other electronic devices coupled to the interconnect strip may communicate with the plurality of blade servers via the internal signal paths of the interconnect strip.

Figure 6A:
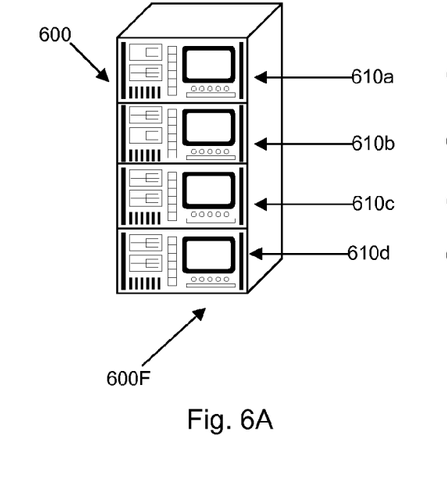
FIGS. 6A and 6B are a block diagram of a rackmount system including an interconnect strip according to one embodiment of the present invention.

The present invention addresses many of the problems presented by traditional rackmount and blade server systems by providing an interconnect strip adapted for mounting in a rackmount system. FIG. 6A is a block diagram of a front view 600F of rackmount system 600 including interconnect strip 690 according to one embodiment of the present invention. Rackmount system 600 includes four rack-mounted electronic devices 610a, 610b, 610c and 610d. Rack-mounted electronic devices 610a, 610b, 610c, and 610d comprise a variety of rackmount devices, such as server units, storage units, storage controller units, input/output units, shared input/output units, expansion slot units, random access memory (RAM) units, switch units, and/or other electronic devices adapted for mounting in a rackmount server system.

Figure 6B:
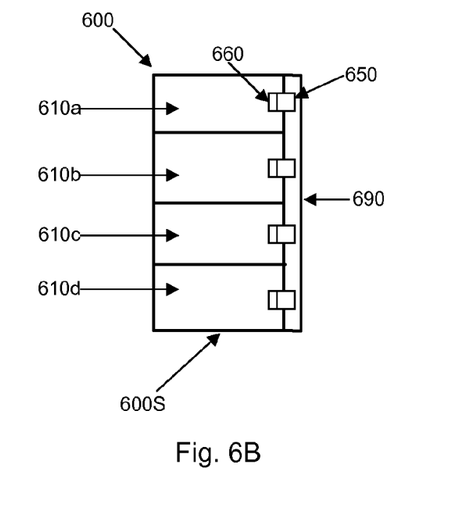

Rackmount system 600 also includes interconnect strip 690 (not visible in front view) coupled to the back of rackmount system 600. In alternative embodiments, interconnect strip 690 may be coupled to a side or the front of rackmount system 600. FIG. 6B illustrates a cutaway side view of rackmount system 600. Interconnect strip 690 includes a plurality of mated data connectors 650 that are adapted to couple to mated data connectors 660 included on rack-mounted electronic device 610a-610d. The plurality of mated data connectors 650 of interconnect strip 690 are regularly spaced along an outer surface of interconnect strip 690 such that rackmount devices of varying sizes may be utilized in rackmount system 600. For example, the plurality of data connectors 650 of interconnect strip 690 may be spaced 1U apart to enable devices 1U or larger to be able to plug into interconnect strip 690.

The present embodiment advantageously eliminates external data cables for interconnecting devices in rackmount system 600. Instead, interconnect strip 690 includes a plurality of internal signal paths adjacent to and corresponding to each of the plurality of data connectors. The plurality of signal paths are adapted for routing data to and from the plurality of data connectors 650. The plurality of signal paths may include electrical and/or optical signal transmission mediums. In some embodiments, the plurality of signal paths are bidirectional, while in other embodiments, the plurality of signal paths are unidirectional. The data paths may be adapted to transport data signals in a variety of formats, including Fibre Channel, InfiniBand, Keyboard, Video, Mouse (KVM) signals, Peripheral Component Interconnect-Express (PCI Express), memory access, Ethernet (10 Mb/s, 100 Mb/s, 1 Gb/s) and/or 10 gigabit Ethernet (10 GbE) signals. Various implementations of the interconnect strip and signal paths are describe in FIGS. 7-10 below.

In alternative embodiments, rack mounted server units are not directly coupled to the interconnect strip. Instead, rack mounted server units are connected to the interconnect strip via a reduced-length cable. Referring back to FIG. 2, a typical rackmount system may include a plethora of data cables connecting electronic components, which can introduce a number of maintenance and performance problems. An embodiment of the present invention advantageously addresses at least the problems with typical rackmount systems described above by utilizing an interconnect strip and reduced-length data cables for coupling electronic devices to the interconnect strip.

Figure 7:
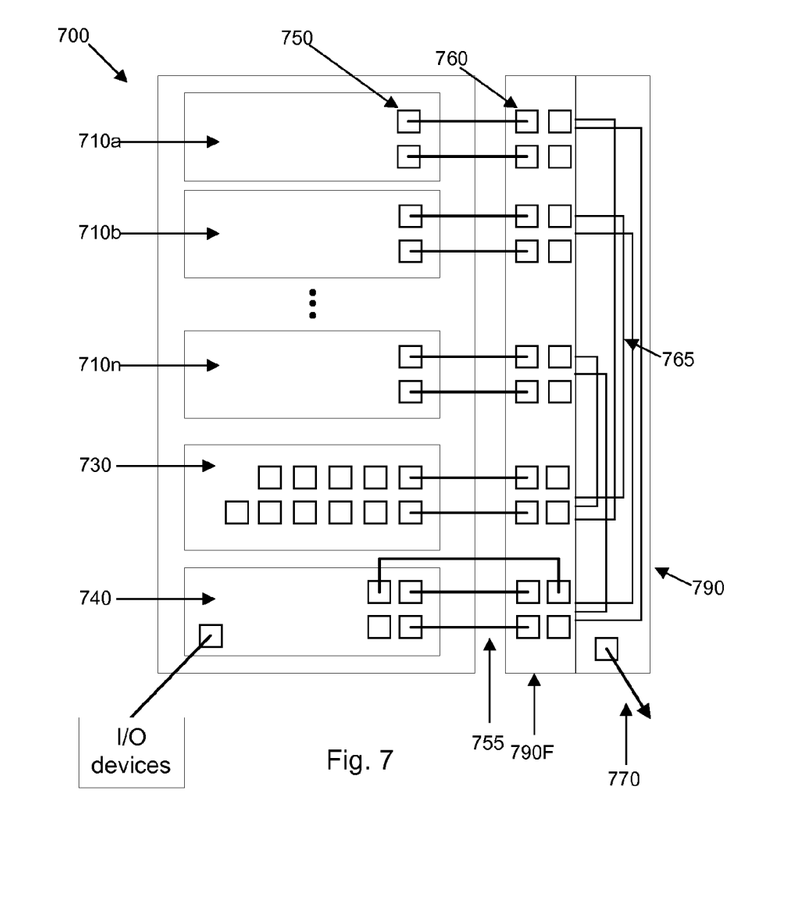
FIG. 7 is a block diagram of a rackmount system including a passive electrical interconnect strip according to one embodiment of the present invention.

FIG. 7 is a block diagram of a rackmount system 700 including an interconnect strip 790 with a passive electrical system according to one embodiment of the present invention. Interconnect strip 790 performs connects ports passively in a pre-arranged pattern similar to a patch panel. A patch panel is typically a rack-mounted panel that houses a plurality of data cable connections. Typically, shorter patch cables are used to connect electronic devices to the patch panel. For example, one end of a patch cable plugs into a data connector of an electronic device and the other end of the patch cable plugs into one of a plurality of data connectors on a front side of the patch panel. Patch panels allow computer and electrical technicians to quickly set up and modify data paths for select signals.

System 700 includes rack-mounted devices 710a-710n, switch 730 and management switch 740 mounted in rackmount system 700. Rack-mounted devices 710a-710n, switch 730 and management switch 740 include a plurality of data connectors 750 for inputting and outputting data signals to and from the various electronic components mounted in rackmount system 700. Interconnect strip 790 includes a plurality of data connectors 760 on the front side of an outside surface 790F of interconnect strip 790. The plurality of data connectors 760 are distributed along the outside surface of interconnect strip 790 at regular intervals corresponding to the spacing of rackmount electronic devices. For example, the plurality of data connectors 760 may be spaced as every 1U or some multiple of 1U where the interconnect strip is designed to be coupled to a conventional interconnect strip system where the rackmount devices are multiples of 1U in height.

In the present embodiment, the plurality of data connectors 760 are distributed along the front side of an outer surface of interconnect strip 790. One skilled in the art will recognize that in alternative embodiments of the present invention, the distribution of the plurality of data connectors 760 is not limited to a front side of the outer surface of interconnect strip 790 and that the plurality of data connectors 760 may be distributed along various sides and/or multiple sides of interconnect strip 790. For example, in an embodiment, the plurality of data connectors 760 may be distributed along a back side of interconnect strip 790. FIGS. 8-11 also depict the plurality of data connectors being located on the front side of an outer surface of an interconnect strip. The plurality of the data connectors in the embodiments described in FIGS. 8-11 also are not limited to the front side of an outer surface of the interconnect strip, and may similarly be distributed along various sides and/or multiple sides of the interconnect strip.

The plurality of data cables 755 provide an electronic signal propagation medium for transmitting data signals to and from the rack-mounted electronic devices and interconnect strip 790. One end of each data cable 755 is coupled to one of the plurality of data connectors 750 on the various electronic devices and the other end of each data cable 755 is coupled to one of the plurality of data connectors 760 of interconnect strip 790. The distribution of the plurality of data connectors 760 enables the plurality data cables 755 to be short, equal length jumpers. Thus, the need to create long and expensive custom-length data cables to interconnect rackmount devices is eliminated. Conventional cables such as twisted-pair Ethernet cable and conventional connectors such as eight position, eight conductors ("8P8C") modular connectors provide an inexpensive solution made possible by the short distance between the electronic devices and interconnect strip 790 that needs to be spanned. Furthermore, the short cable length eliminates the need for cable bundles and/or cable harnesses to route cables through the rackmount system, which may simplify fault detection by eliminating the tangle of cables present in a typical rackmount system.

In the embodiment illustrated in FIG. 7, interconnect strip 790 includes a passive electronic cabling implementation of the present invention. The plurality of internal signal paths 765 comprises electrical signal media, such as electrical cables, that interconnect the plurality of data connectors 760. For example, in the present embodiment, rackmount system 700 includes a switch 730. The plurality of internal signal paths 765 provides connectivity between data connectors 760 of interconnect strip. Therefore, switch 730 and management switch 740 are included to provide switching capabilities to rackmount system 700.

In alternative embodiments of the present invention, interconnect strip 790 may include an active electronic cabling implementation to provide additional functionality that would typically be found in one or more rack-mounted components. For example, interconnect strip 790 may incorporate the switching functionality of switch 730 and/or management switch 740, eliminating the need to include switch 730 and/or management switch 740 in the traditional rackmount space. Integrating the functionality of these components into interconnect strip 790 advantageously conserves rackmount space for other components and simplifies the interconnection of rackmount components by shielding a user of the system from the details of configuring switching functionality.

In other embodiments of the present invention, an interconnect strip may incorporate additional active functionality. For example, in some embodiments of the present invention the interconnect strip performs signal aggregation and/or translation functions. In one embodiment, incoming signals received by the interconnect strip from rack-mounted electronic devices coupled to the interconnect strip are aggregated onto a single output fiber port 770 for uplinking to a central location.

In yet other embodiments of the present invention, passive optical signal paths are provided instead of electrical signal paths and rack-mounted resources include optical ports that are coupled to interconnect strip 790 via optical cables. In passive optical embodiments interconnect strip 790, the plurality of internal signal paths 765 comprise optical data signal paths, such as fiber optic cables, in order to take advantage of the higher data rates provided by optical communications. In passive optical embodiment of interconnect strip 790, the plurality of data cables 755 provide an optical signal propagation medium, such as a fiber optic cable, for transmitting data signals to and from the rack-mounted electronic devices and interconnect strip 790. Furthermore, data connectors 750 of the various electronic devices and the plurality of data connectors 760 of interconnect strip 790 are optical data connectors in passive optical embodiments of the present invention.

As described above, separate management and data connections may be provided in a typical rackmount system. Various embodiments of the present invention may also provide separate management and data connections, while other embodiments provide a single connection for transmitting both data and control signals. For example, according to one embodiment of the present invention, a 100 megabit per second Ethernet data connection and a KVM management connection may be provided. According to another embodiment of the present invention, both the data and management connections may comprise Ethernet connections, but the management connection is a lower bandwidth connection. For example, the data management connection may comprise a 10 gigabit Ethernet connection while the management connection comprises only a 100 megabit per second Ethernet connection. KVM or other control signals are sent over the slower management Ethernet connection. According to yet another embodiment of the present invention, a single high-bandwidth connection is provided for both data and control signals. For example, a 10 Gigabit Ethernet connection may be provided to handle both data and control signals.

Figure 8:
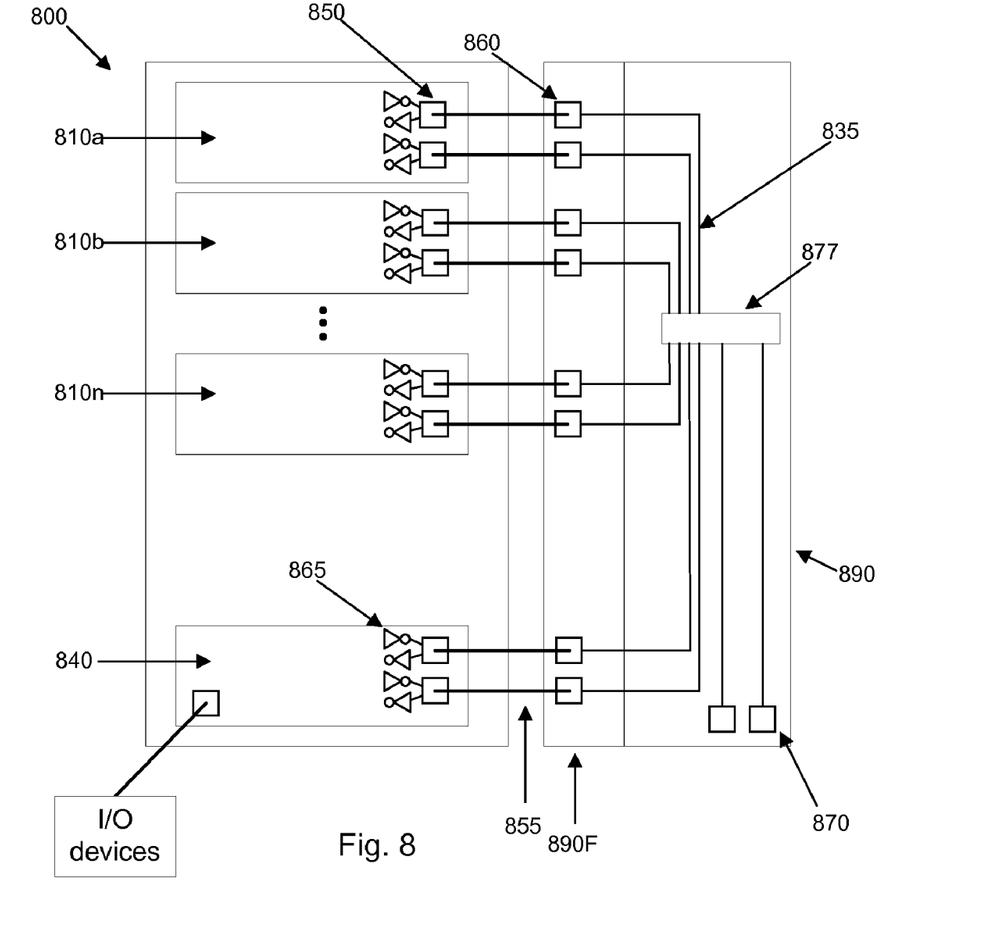
FIG. 8 is a block diagram of a rackmount system including an active optical interconnect strip according to one embodiment of the present invention.

FIG. 8 is a block diagram of a rackmount system 800 including an active optical interconnect strip 890 according to one embodiment of the present invention. Rack-mounted devices 810a-810n and 840 are mounted in rackmount system 800. Rack-mounted devices 810a-810n, and 840 include a plurality of data connectors 850 for inputting and outputting optical data signals to and from the various electronic components mounted in rackmount system 800. Interconnect strip 890 includes a plurality of optical data connectors 860 on the front side of an outside surface 890F of interconnect strip 890. The plurality of optical data connectors 860 are distributed along the outside surface of interconnect strip 890 at regular intervals corresponding to the spacing of rackmount electronic devices. For example, the plurality of data connectors 860 may be spaced as every 1U or some multiple of 1U where the interconnect strip is designed to be coupled to a conventional interconnect strip system where the rackmount devices are multiples of 1U in height. Interconnect strip 890 also includes an includes a plurality of internal signal paths 835 comprising optical signal media, such as a waveguide or optical fiber, that interconnect the plurality of data connectors 860.

The plurality of data cables 855 provide an optical signal propagation medium for transmitting data signals to and from the rack-mounted electronic devices and interconnect strip 890. One end of each data cable 855 is coupled to one of the plurality of data connectors 850 on the various electronic devices and the other end of each data cable 855 is coupled to one of the plurality of data connectors 860 of interconnect strip 890. Each data connector 850 is coupled to an electric-optical transceiver 865 integrated into each of the various rackmount devices. Electrical-optical transceiver 865 receives electrical data signals from the rackmount device into which electrical-optical transceiver 865 is integrated and converts the electrical data signals to optical data signals. Optical signals are transmitted to and received from interconnect strip 890 via data connector 850 which is coupled to data cable 855. Electrical-optical transceiver 865 also receives optical data signal inputs via data connector 865 and converts the optical data signals to electrical data signals which are provided to the rackmount device into which electrical-optical transceiver 865 is integrated. Electrical-optical transceiver 865 may be implemented in different ways, including that disclosed in concurrently filed U.S. patent application Ser. No. 11/681,950.

The distribution of the plurality of data connectors 860 enables the plurality data cables 855 to be short, equal length jumpers. Thus, the need to create long and expensive custom-length data cables to interconnect rackmount devices is eliminated. Short, equal length jumpers advantageously provide a consistent, low-latency connection between rackmount devices and the interconnect strip. Conventional fiber optic cables and conventional fiber optic connectors provide an inexpensive solution for spanning the short distance between the various rackmount electronic devices and interconnect strip 890. Furthermore, the short cable length eliminates the need for cable bundles and/or cable harnesses to route cables through the rackmount system, which may simplify fault detection by eliminating the tangle of cables present in a typical rackmount system. Moreover, the use of optical signals rather than electrical signals further reduces signal distortion for transmitting data to and from the various electronic components coupled to interconnect strip system 890.

In some embodiments, incoming signals received by the interconnect strip from rack-mounted electronic devices coupled to the interconnect strip are aggregated onto a single output fiber port 870 for uplinking to a central location. In some embodiments, interconnect strip system 890 also includes active function unit 877. Active function unit 877 may include at least one or more of the following functionalities: optical switching functionality, signal aggregation functionality, distribution functionality, and electrical-optical (EO) switching functionality which may also include electrical serializer/deserializer ("SERDES") functionality. Active function unit 877 is illustrated as a single component of interconnect strip 890, however, active function unit 877 may comprise one or more separate or interconnected components that perform the functions of active function unit 877 described herein.

Where active function unit 877 includes optical switching functionality, an optical switch is provided that controls the flow of a lightpath between input and output ports on the switch. Optical switches include a plurality of purely optical datapaths. No electrical-to-optical or optical-to-electrical signal conversion of the data signals is performed. The inputs and outputs of the optical switches are purely optical. Note that it is possible that some electronic components may be included in the switch to control optical devices in the switch, but the electronic components are not part of the datapath.

The optical signal aggregation included in active function unit 877 may, for example, be optical wavelength-division multiplexing ("WDM"). Optical WDM allows for multiple optical carrier signals on a single waveguide optical fiber by using different wavelengths of light to carry different signals. WDM employs an optical multiplexer (MUX) to combine optical signals at different wavelengths into a single waveguide or optical fiber. At the opposite end of the fiber, an optical de-multiplexer (DeMUX) splits the signal at each wavelength apart into individual signals. Systems using optical MUX and DeMUX for WDM can achieve very high bandwidth densities in a single channel.

The distribution functionality included in active function unit 877 may include bundling of links and/or fan-in/fan-out cables. A fan-in/fan-out cable combines the functionality of a fan-in and fan-out cable. A fan-in cable provides a means for receiving multiple inputs and providing a single output. For example, if a fan-in cable includes four inputs each of which comprise an individual data channel, the fan-in output produces a single output comprising four channels. Thus, a fan-in cable allows multiple devices to communicate with a single device. In contrast, a fan-out cable is configured such that multiple outputs are produced from a single input. A fan-in cable, therefore, allows a single device to output a signal to multiple devices. For example, a fan-out cable including four data channels in the input may branch into four outputs, with each output including a single data channel. A fan-in cable may be used to enable allows multiple devices on a network to communicate using a single network attachment. Furthermore, a fan-out cable may be used to enable a single device to communicate with multiple devices using a single network attachment. A fan-in/fan-out cable combines the functionality of a fan-in cable and a fan-out cable. A fan-in/fan-out cable allows, for example, matrix communication of many-to-many devices using a single network attachment.

In some embodiments, active function unit 877 includes EO switching functionality. EO switching functionality comprises enhanced electrical packet-based switches that provide an electrical-to-optical (EO) and optical-to-electrical (OE) interface at some of the ports of the switch. Note that while the functionality described herein is referred to as EO switching functionality, the functionality included in active function unit 877 may include both EO and OE functionality. Data is switched electrically but propagates between the switch and compute nodes optically. The EO switching functionality allows interconnect strip system 890 to take full advantage of the capabilities of electrical switches while providing a low power, high-bandwidth signal path between the switch and compute nodes.

Figure 9:
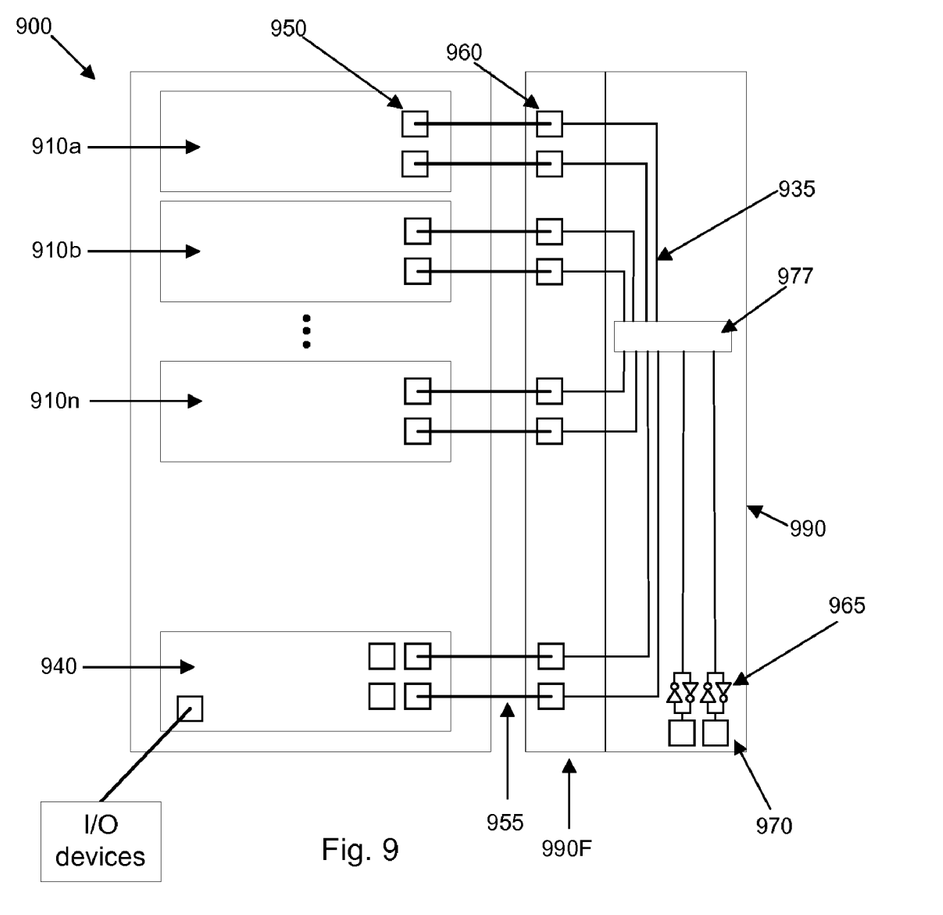
FIG. 9 is a block diagram of a rackmount system including an active electrical interconnect strip according to an embodiment of the present invention.

FIG. 9 is a block diagram of a rackmount system including an active electrical interconnect strip according to an embodiment of the present invention. Rack-mounted devices 910*a*-910*n* and 940 are mounted in rackmount system 900. Rack-mounted devices 910*a*-910*n* and 940 include a plurality of data connectors 950 for inputting and outputting electrical data signals to and from the various electronic components mounted in rackmount system 900. Interconnect strip 990 includes a plurality of electrical data connectors 960 on the front side of an outside surface 990F of interconnect strip 990. The plurality of electrical data connectors 960 are distributed along the outside surface of interconnect strip 990 at regular intervals corresponding to the spacing of rackmount electronic devices. For example, the plurality of data connectors 960 may be spaced as every 1U or some multiple of 1U where the interconnect strip is designed to be coupled to a conventional rackmount system where the rackmount devices are multiples of 1U in height. Interconnect strip 990 also includes an includes a plurality of internal signal paths 935 comprising electrical signal media, such as electrical cables or printed circuit board traces, that interconnect the plurality of data connectors 960.

The plurality of data cables 955 provide an electrical signal propagation medium for transmitting data signals to and from the rack-mounted electronic devices and interconnect strip 990. One end of each data cable 955 is coupled to one of the plurality of data connectors 950 on the various electronic devices and the other end of each data cable 955 is coupled to one of the plurality of data connectors 960 of interconnect strip 990.

The distribution of the plurality of data connectors 960 enables the plurality data cables 955 to be short, equal length jumpers. Thus, the need to create long and expensive custom-length data cables to interconnect rackmount devices is eliminated. Short, equal length jumpers advantageously provide a consistent, low-latency connection between rackmount devices and the interconnect strip. Conventional electrical cables and conventional electrical connectors provide an inexpensive solution for spanning the short distance between the various rackmount electronic devices and interconnect strip 990. Furthermore, the short cable length eliminates the need for cable bundles and/or cable harnesses to route cables through the rackmount system, which may simplify fault detection by eliminating the tangle of cables present in a typical rackmount system.

In some embodiments, interconnect strip system 990 also includes active function unit 977. Active function unit 977 may include at least one or more of the following functionalities: switching functionality, signal aggregation functionality, distribution functionality. Active function unit 977 is illustrated as a single component of interconnect strip 990, however, active function unit 977 may comprise one or more separate or interconnected components that perform the functions of active function unit 877 described herein.

Where active function unit 977 includes electrical switching functionality, an electrical switch is provided that controls the flow of electrical data signals between input and output ports on the switch. A plurality of datapaths through the switch are provided, the data paths comprising metal and semiconductor pathways. Typical electrical switches are packet-based switches. For example, active function unit 977 may include a 24-port Gigabit Ethernet switch. Packet-based switching allows physical channels to be shared logically by controlling the flow of digital packets between the ports.

The optical signal aggregation included in active function unit 977 may, for example, be electrical serializer/deserializer ("SERDES") functionality. In SERDES, a serializer converts a parallel data stream to a serial data stream at a higher rate. For example, if the input is a four-bit wide parallel bus, the output stream is 1-bit wide but transfers bits at a rate four times that of the 4-bit wide parallel bus. A deserializer performs the opposite task of converting the serial data stream back into a parallel stream at the original rate.

The distribution functionality included in active function unit 977 may comprise bundling of links and/or fan-in/fan-out cables. Fan-in/fan-out cables are described above in FIG. 8.

In some embodiments, electrical-optical (EO) transceiver 965 may receive electrical data signals from the plurality of rackmount devices and/or active function unit 977. EO transceiver 965 converts the electrical data signals to optical data signals to be output over an optical data connection coupled to optical uplink port 970. Electrical-optical transceiver 965 also receives optical data signal inputs from data sources external to the rackmount system via data optical uplink port 970 and converts the optical data signals to electrical data signals which are provided to active function unit 977 which may transmit the signals to one or more of the rack-mounted electronic devices. Electrical-optical transceiver 965 may be implemented in different ways, including that disclosed in concurrently filed U.S. patent application Ser. No. 11/681, 950.

Figure 10:
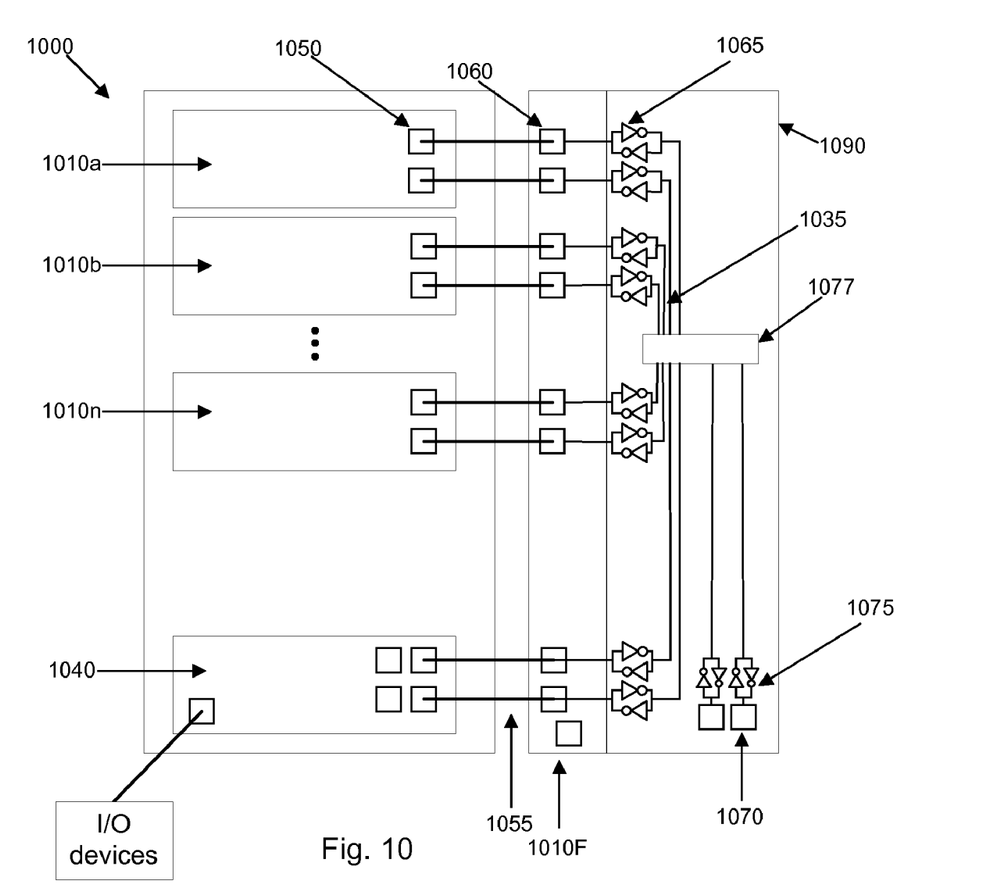
FIG. 10 is a block diagram of a rackmount system including an active optical interconnect strip with electrical-optical conversion according to an embodiment of the present invention.

FIG. 10 is a block diagram of a rackmount system 1000 including an active optical interconnect strip 1090 with electrical-optical conversion according to an embodiment of the present invention. System 1000 provides electrical-optical transceivers integrated into interconnect strip 1090 for receiving electrical data signals from rack mounted devices and transmitting optical signals across the plurality of data signal paths of the interconnect strip and vice versa. Optical connections within interconnect strip 1090 advantageously permit digital communications over larger distances and at higher data rates than electronic components. Furthermore, electronic devices in rackmount system 1000 are coupled to interconnect strip 1090 via plurality electrical data cables 1055 comprising short, equal-length jumpers that provide a consistent, low-distortion connection between rackmount devices and interconnect strip 1090. The use of short, equal-length jumpers also eliminates the need to create long and expensive custom-length data cables to interconnect rackmount devices.

Rack-mounted devices 1010*a*-1010*n* and 1040 are mounted in rackmount system 1000. Rack-mounted devices 1010*a*-1010*n* and 1040 include a plurality of data connectors 1050 for inputting and outputting electrical data signals to and from the various electronic components mounted in rackmount system 1000. Interconnect strip 1090 includes a plurality of electrical data connectors 1060 on the front side of an outside surface 1090F of interconnect strip 1090. The plurality of electrical data connectors 1060 are distributed along the outside surface of interconnect strip 1090 at regular intervals corresponding to the spacing of rackmount electronic devices. For example, the plurality of data connectors 1060 may be spaced as every 1U or some multiple of 1U where the interconnect strip is designed to be coupled to a conventional rackmount system where the rackmount devices are multiples of 1U in height. Interconnect strip 1090 also includes an includes a plurality of internal signal paths 1035 comprising optical signal media, such as a waveguide or optical fiber, that interconnect the plurality of data connectors 1060. Each data connector 1060 is coupled to an electric-optical transceiver 1065. Each electrical-optical transceiver 1065 receives electrical data signals from one of the various rackmount devices via data connector 1060, converts the electrical data signals to optical data signals, and transmits the optical data signals over the plurality of internal signal paths 1035. Electrical-optical transceiver 1065 also converts optical data signals received from the plurality of signal paths 1035 to electrical data signals and transmits the electrical data signals to an electronic device coupled to data connector 1060 via data cable 1055. Electrical-optical transceiver 1065 may be implemented in different ways, including that disclosed in concurrently filed U.S. patent application Ser. No. 11/681,950.

The plurality of data cables 1055 provide an electrical signal propagation medium for transmitting data signals to and from the rack-mounted electronic devices and interconnect strip 1090. One end of each data cable 1055 is coupled to one of the plurality of data connectors 1050 on the various electronic devices and the other end of each data cable 1055 is coupled to one of the plurality of data connectors 1060 of interconnect strip 1090.

The distribution of the plurality of data connectors 1060 enables the plurality data cables 1055 to be short, equal length jumpers. Thus, the need to create long and expensive custom-length data cables to interconnect rackmount devices is eliminated. Short, equal length jumpers advantageously provide a consistent, low-latency connection between rackmount devices and the interconnect strip. Conventional electrical cables and conventional electrical connectors provide an inexpensive solution for spanning the short distance between the various rackmount electronic devices and interconnect strip 1090. Furthermore, the short cable length eliminates the need for cable bundles and/or cable harnesses to route cables through the rackmount system, which may simplify fault detection by eliminating the tangle of cables present in a typical rackmount system.

In some embodiments, interconnect strip system 1090 also includes active function unit 1077. Active function unit 1077 may include at least one or more of the following functionalities: optical switching functionality, signal aggregation functionality, distribution functionality, and electrical-optical (EO) switching functionality which may also include electrical serializer/deserializer ("SERDES") functionality. The various functionalities of active function unit 1077 functions are similar to those of active function unit 877 described in detail above. Active function unit 1077 is illustrated as a single component of interconnect strip 1090, however, active function unit 1077 may comprise one or more separate or interconnected components that perform the functions of active function unit 1077 described herein.

In some embodiments, electrical-optical (EO) transceiver 1075 may receive electrical data signals from the plurality of rackmount devices and/or active function unit 1077. EO transceiver 1075 converts the electrical data signals to optical data signals to be output over an optical data connection coupled to optical uplink port 1070. Electrical-optical transceiver 1075 also receives optical data signal inputs from data sources external to the rackmount system via data optical uplink port 1070 and converts the optical data signals to electrical data signals which are provided to active function unit 1077 which may transmit the signals to one or more of the rack-mounted electronic devices. Electrical-optical transceiver 1075 may be implemented in different ways, including that disclosed in concurrently filed U.S. patent application Ser. No. 11/681,950.

Figure 11:
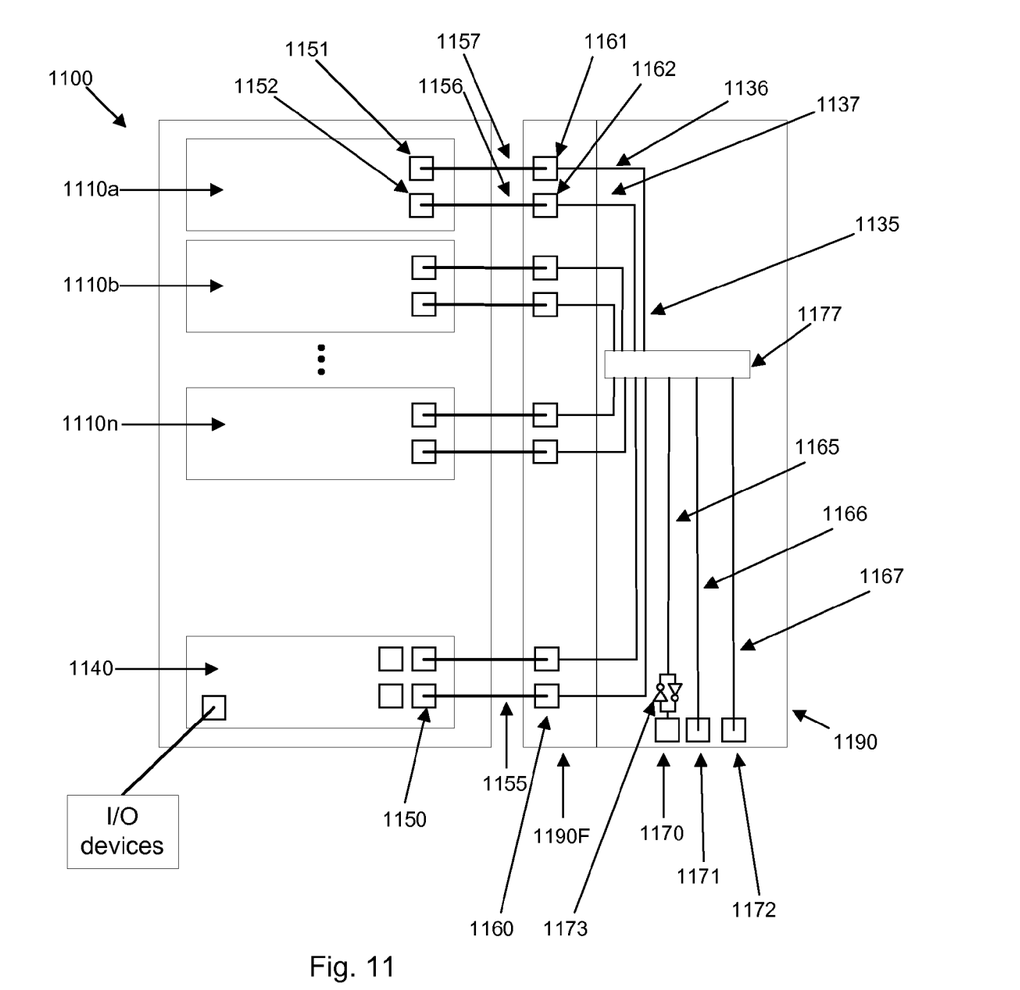
FIG. 11 is a block diagram of a rackmount system including an active electrical and optical interconnect strip with optical uplink ports according to an embodiment of the present invention.

FIG. 11 is a block diagram of a rackmount system including an active electrical and optical interconnect strip with optical uplink ports according to an embodiment of the present invention. Rack-mounted devices 1110a-1110n and 1140 are mounted in rackmount system 1100. Rack-mounted devices 1110a-1110n and 140 include a plurality of data connectors 1150 for inputting and outputting electrical data signals to and from the various electronic components mounted in rackmount system 1100. Interconnect strip 1190 includes a plurality of electrical data connectors 1160 on the front side of an outside surface 1190F of interconnect strip 1190. The plurality of electrical data connectors 1160 are distributed along the outside surface of interconnect strip 1190 at regular intervals corresponding to the spacing of rackmount electronic devices. For example, the plurality of data connectors 1160 may be spaced as every 1U or some multiple of 1U where the interconnect strip is designed to be coupled to a conventional interconnect strip system where the rackmount devices are multiples of 1U in height. Interconnect strip 1190 also includes an includes a plurality of internal signal paths 1135 comprising electrical signal media, such as electrical cable, and optical signal media, such as waveguides or optical fiber, that interconnect the plurality of data connectors 1160.

The plurality of data cables 1155 provide an signal propagation medium for transmitting data signals to and from the rack-mounted electronic devices and interconnect strip 1190. One end of each data cable 1155 is coupled to one of the plurality of data connectors 1150 on the various electronic devices and the other end of each data cable 1155 is coupled to one of the plurality of data connectors 1160 of interconnect strip 1190.

The distribution of the plurality of data connectors 1160 enables the plurality data cables 1155 to be short, equal length jumpers. The benefits provided by the jumpers are discussed above regarding FIGS. 7-9. Here, the jumpers may comprise either conventional electrical cables or conventional optical fiber, depending upon whether an optical or electrical connection is being established between an electronic device and the interconnect strip.

In some embodiments, interconnect strip system 1190 also includes active function unit 1177. Active function unit 1177 may include at least one or more of the following functionalities: electrical and/or optical switching functionality, signal aggregation functionality, distribution functionality. Active function unit 1177 is illustrated as a single component of interconnect strip 1190, however, active function unit 1177 may comprise one or more separate or interconnected components that perform the functions of active function unit 1177 described herein.

Active function unit 1177 may include both electrical and optical functionality in the present embodiment. For example, active function unit 1177 may incorporated optical signal related functionality, such as the functionality of active function unit 877 described above. Similarly, active function unit may also incorporate electrical signal related functionality, such as the functionality of active function unit 977 described above.

The present embodiment of the invention advantageously allows rack-mounted electronic devices to connect to interconnect strip 1190 via one or more optical and/or electrical cables. For example, rack-mounted device 110*a* includes both optical and electrical data connectors. Data connector 1151 is an optical data connector that is coupled to optical data connector 1161 of interconnect strip 1190 via an optical data cable 1157. Optical data connector 1161 is coupled to optical internal signal path 1136 which is coupled to active function unit 1177. Data connector 1152 is an electrical data connector that is coupled to electrical data connector 1162 of interconnect strip 1190 via an electrical data cable 1156. Electrical data connector 1162 is coupled to electrical internal signal path 1137 which is coupled to active function unit 11177.

The present embodiment also provides for electrical, optical, and electrical-optical uplink ports that include EO conversion. The uplink ports provide for handling bidirectional communications to and from rackmount system 1100. For example, interconnect strip 1190 may include one or more optical uplink ports 1172. Optical uplink port 1172 is coupled to optical internal signal path 1167 and internal signal path 1167 is also coupled to active function unit 1177.

Interconnect strip 1190 may also include one or more electrical uplink ports 1171. Electrical uplink port 1171 is coupled to electrical internal signal path 1166 and electrical internal signal path 1166 is also coupled to active function unit 1177.

Interconnect strip 1190 may also include one or more electrical-optical uplink ports that include EO conversion 1170. Uplink port 1170 is an optical uplink port. Uplink port 1170 is coupled to EO transceiver 1173. EO transceivers are described above in greater detail with respect to EO transceiver 1065. Here EO transceiver 1173 receives optical data signals from uplink port 1170 and converts the optical data signals to electrical data signals. EO transceiver 1173 is coupled to electrical signal path 1165 and EO transceiver 1173 transmits the electrical data signals across electrical signal path 1165 to active function unit 1177. EO transceiver 1173 also receives electrical data signals from active function unit 1177 and converts the electrical data signals to optical data signals which are output via uplink port 1170. In other embodiments, uplink port 1170 comprises an electrical data port and EO transceiver 1173 converts electrical data signals received via uplink port to optical data signals and transmits the optical data signals across an optical data path to active function unit 1177 and vice versa.

The embodiments described above provide an interconnect strip comprising a connector module including a longitudinal body adapted for installation in a computer rack capable of housing a multiple electronic devices such as servers in a stack configuration. The connector module includes a plurality of data connectors mounted on an outer surface. The data connectors are adapted to receive a signal source from one or more of the servers in the computer rack. The signal source may produce signals in a variety of formats known to the art, including KVM signals, InfiniBand signals, Fibre Channel signals, memory access signals, PCI-Express signals, Ethernet (10 Mb/s, 100 Mb/s, 1 Gb/s and 10 gigabit Ethernet) signals, and/or other optical and/or electrical signal types.

Computer programs incorporating various features of the present invention may be encoded on various computer readable media for storage and/or transmission; suitable media include magnetic disk or tape, optical storage media such as compact disk (CD) or DVD (digital versatile disk), flash memory, and the like. Such programs may also be encoded and transmitted using carrier signals adapted for transmission via wired, optical, and/or wireless networks conforming to a variety of protocols, including the Internet. Computer readable media encoded with the program code may be packaged with a compatible device or provided separately from other devices (e.g., via Internet download).

Thus, although the invention has been described with respect to specific embodiments, it will be appreciated that the invention is intended to cover all modifications and equivalents within the scope of the following claims.

What is claimed is:

1. A connector module comprising:
a longitudinal body installed in a computer equipment rack that houses a plurality of rack-mount devices positioned in a stack configuration;
a first plurality of data connectors mounted along an outer surface of the longitudinal body, each of the first plurality of data connectors being located at a different longitudinal location along the outer surface and receiving a signal source introduced from a side of the outer surface; and
an internal collection of signal paths affixed to the longitudinal body, the internal collection of signal paths being coupled to the first plurality of data connectors;
wherein the longitudinal body is installed in a transverse orientation relative to the plurality of rack-mount devices in the stack configuration, to position each of the first plurality of data connectors in proximity to a connector mounted on a corresponding one of the plurality of rack-mount devices.

2. The connector module of claim 1, wherein the first plurality of data connectors are spaced along the outer surface of the longitudinal body such that each of the first plurality of data connectors is aligned with a data connector mounted on a corresponding one of the plurality of rack mount devices.

3. The connector module of claim 1, wherein the first plurality of data connectors are spaced one rackmount unit apart along the outer surface of the longitudinal body.

4. The connector module of claim 1 wherein the connector module comprises multiple pluralities of data connectors mounted along the outer surface of the longitudinal body, the multiple pluralities of data connectors including the first plurality of data connectors and a second plurality of data connectors, each one of the second plurality of data connectors being located adjacent to a corresponding one of the first plurality of data connectors.

5. The connector module of claim 1 wherein the longitudinal body is adapted for installation to allow each of the first plurality of data connectors to connect, via a reduced-length cable, to the connector mounted on the corresponding one of the plurality of rack-mount devices, wherein each reduced-length cable is of substantially the same length.

6. The connector module of claim 1 wherein the longitudinal body is adapted for installation to allow each of the first plurality of data connectors to connect directly to the connector mounted on the corresponding one of the plurality of rack-mount devices.

7. The connector module of claim 1 wherein the internal collection of signal paths includes electrical signal paths.

8. The connector module of claim 1 wherein the internal collection of signal paths includes optical signal paths.

9. The connector module of claim 1 wherein the internal collection of signal paths comprises passive components.

10. The connector module of claim 1 wherein the internal collection of signal paths comprises active components.

11. The connector module of claim 1 wherein the internal collection of signal paths comprises an electrical-optical transceiver.

12. The connector module of claim 1 wherein the internal collection of signal paths comprises a switch, adapted for switching electrical data signals.

13. The connector module of claim 12 wherein the switch is adapted for switching PCI-Express data signals.

14. The connector module of claim 12 wherein the switch is adapted for switching Ethernet data signals.

15. The connector module of claim 12 wherein the switch is adapted for switching keyboard-video-mouse (KVM) data signals.

16. The connector module of claim 12 wherein the switch is adapted for switching InfiniBand data signals.

17. The connector module of claim 12 wherein the switch is adapted for switching Fibre Channel data signals.

18. The connector module of claim 12 wherein the switch is adapted for switching Asynchronous Transfer Mode (ATM) signals.

19. The connector module of claim 12 wherein the switch is adapted for switching Synchronous Optical Networking (SONET) signals.

20. The connector module of claim 1 wherein the internal collection of signal paths comprises a switch, adapted for switching optical data signals.

21. The connector module of claim 20 wherein the switch is adapted for switching Fibre Channel data signals.

22. The connector module of claim 20 wherein the switch is adapted for switching Ethernet signals.

23. The connector module of claim 20 wherein the switch is adapted for switching Infiniband signals.

24. The connector module of claim 20 wherein the switch is adapted for switching PCI-Express signals.

25. The connector module of claim 20 wherein the switch is adapted for switching Asynchronous Transfer Mode (ATM) signals.

26. The connector module of claim 20 wherein the switch is adapted for switching Synchronous Optical Networking (SONET) signals.

27. The connector module of claim 20 wherein the switch is adapted for switching keyboard-video-mouse (KVM) data signals.

28. The connector module of claim 1 wherein the internal collection of signal paths comprises a signal aggregation unit.

29. The connector module of claim 28 wherein the signal aggregation unit comprises an electrical time-division serializer-deserializer.

30. The connector module of claim 28 wherein the signal aggregation unit comprises an optical wavelength-division multiplexer-demultiplexer.

31. The connector module of claim 1 wherein the internal collection of signal paths comprises a signal distribution unit.

32. The connector module of claim 1 wherein the signal distribution unit comprises a fan-out/fan-in cable.

33. The connector module of claim 1 wherein at least a portion of the internal collection of signal paths is configured to carry Ethernet data signals.

34. The connector module of claim 1 wherein at least a portion of the internal collection of signal paths is configured to carry keyboard video mouse (KVM) data signals.

35. The connector module of claim 1 wherein at least a portion of the internal collection of signal paths is configured to carry InfiniBand data signals.

36. The connector module of claim 1 wherein at least a portion of the internal collection of signal paths is configured to carry Fibre Channel data signals.

37. The connector module of claim 1 wherein at least a portion of the internal collection of signal paths is configured to carry memory access data signals.

38. The connector module of claim 1 wherein at least a portion of the internal collection of signal paths is configured to carry PCI-Express data signals.

39. The connector module of claim 1 wherein the rack-mount device comprises a server unit.

40. The connector module of claim 1 wherein the rack-mount device comprises a storage controller unit.

41. The connector module of claim 1 wherein the rack-mount device comprises a input/output unit.

42. The connector module of claim 1 wherein the rack-mount device comprises a shared input/output unit.

43. The connector module of claim 1 wherein the rack-mount device comprises an expansion slot unit.

44. The connector module of claim 1 wherein the rack-mount device comprises a random access memory (RAM) unit.

45. The connector module of claim 1 wherein the rack-mount device comprises a switch unit.

46. The connector module of claim 1 further comprising an external data connector mounted on the longitudinal body, the external data connector capable of forming an external connection with a resource outside the connector module.

47. The connector module of claim 46 wherein the resource outside the connector module is also located outside the computer equipment rack.

48. The connector module of claim 46 wherein the external connection comprises a single-fiber optical connection.

49. The connector module of claim 46 wherein the external connection comprises a duplex-fiber optical connection.

50. The connector module of claim 46 wherein the external connection comprises a multiple-fiber optical connection.

51. The connector module of claim 1 wherein the connector module is one of a plurality of connector modules installed in one computer equipment rack.

* * * * *